(12) United States Patent
He et al.

(10) Patent No.: US 6,177,312 B1
(45) Date of Patent: Jan. 23, 2001

(54) METHOD FOR REMOVING CONTAMINATE NITROGEN FROM THE PERIPHERAL GATE REGION OF A NON-VOLATILE MEMORY DEVICE DURING PRODUCTION OF SUCH DEVICE

(75) Inventors: Yuesong He; John Jianshi Wang, both of San Jose; Toru Ishigaki, Mountain View; Kent Kuohua Chang, Cupertino; Effiong Ibok, Sunnyvale, all of CA (US)

(73) Assignees: Advanced Micro Devices, Inc., Sunnyvale, CA (US); Fujitsu, Ltd., Kanagawa; Fujitsu AMD Semiconductor Limited (FASL), Fukushima, both of (JP)

( * ) Notice: Under 35 U.S.C. 154(b), the term of this patent shall be extended for 0 days.

(21) Appl. No.: 09/048,459

(22) Filed: Mar. 26, 1998

(51) Int. Cl.[7] ............ H01L 21/28; H01L 21/31; H01L 21/3105; H01L 21/311
(52) U.S. Cl. .............. 438/257; 438/769; 438/720; 438/974
(58) Field of Search ................. 438/477, 115, 438/211, 906, 257, 769, 770, 974

(56) References Cited

U.S. PATENT DOCUMENTS

| | | | |
|---|---|---|---|
| 5,468,687 | * 11/1995 | Carl et al. | 437/235 |
| 5,489,540 | * 2/1996 | Liu et al. | 437/30 |
| 5,672,521 | * 9/1997 | Barsan et al. | 437/24 |
| 5,679,585 | * 10/1997 | Gardner et al. | 437/41 |
| 5,861,347 | * 1/1999 | Maiti et al. | 438/787 |
| 5,926,741 | * 7/1999 | Matsuoka et al. | 438/778 |
| 5,972,804 | * 10/1999 | Tobin et al. | 438/786 |

OTHER PUBLICATIONS

E. C. Carr et al., Appl. Phys. Lett 66 (12), Mar. 20, 1995, "N Depth Profiles in Thin $SiO_2$ Grown of Processed in $N_2O$: The Role of Atomic Oxygen".*

* cited by examiner

Primary Examiner—Mary Wilczewski
Assistant Examiner—James Park
(74) Attorney, Agent, or Firm—Renner, Otto, Boisselle & Sklar

(57) ABSTRACT

This invention relates to a method for removing contaminate nitrogen from the peripheral gate region of a non-volatile memory device during production of said device, wherein at least some of the contaminate nitrogen has formed a bond with the surface of the silicon substrate in contact with the gate oxide layer in said gate region, said method comprising: contacting said gate oxide layer and contaminate nitrogen with a gas comprising ozone at a temperature of about 850° C. to about 950° C. for an effective period of time to break said bond; and removing said gate oxide layer and contaminate nitrogen from said surface of said silicon substrate.

10 Claims, 2 Drawing Sheets

METHOD FOR REMOVING CONTAMINATE NITROGEN FROM THE PERIPHERAL GATE REGION OF A NON-VOLATILE MEMORY DEVICE DURING PRODUCTION OF SUCH DEVICE

TECHNICAL FIELD

This invention relates to an improvement in the fabrication of non-volatile memory devices and, more particularly, to a method for removing contaminate nitrogen from the peripheral gate regions of such memory devices.

BACKGROUND OF THE INVENTION

Oxynitridation is an attractive way for scaling down tunnel oxide during the production of non-volatile memory devices. However, during the oxynitridation process, contaminate nitrogen incorporates into the peripheral transistor gate oxide layer and forms an Si—N bond with the surface of the silicon substrate in contact with the gate oxide layer. This contaminate nitrogen can not be effectively removed using conventional hydrofluoric acid dip or reoxidation techniques. The presence of such contaminate nitrogen contributes to a nonuniform gate oxide growth during subsequent gate oxidation processing. This degrades the peripheral transistor characteristics and makes oxynitridation less attractive for producing non-volatile memory devices. The present invention provides an effective way for removing this contaminate nitrogen and thus provides a solution for growing high quality gate oxide as well as taking advantage of the use of oxynitridation for tunnel oxide.

SUMMARY OF THE INVENTION

This invention relates to a method for removing contaminate nitrogen from the peripheral gate region of a non-volatile memory device during production of said device, wherein at least some of the contaminate nitrogen has formed a bond with the surface of the silicon substrate in contact with the gate oxide layer in said gate region, said method comprising: contacting said gate oxide layer and contaminate nitrogen with a gas comprising ozone at a temperature of about 850° C. to about 950° C. for an effective period of time to break said bond; and removing said gate oxide layer and contaminate nitrogen from said surface of said silicon substrate.

In one embodiment, the present invention relates to a method for treating the surface of a silicon substrate, comprising:

(A) forming spaced field oxide regions on said surface of said silicon substrate, the spaces between said field oxide regions comprising a core area and a peripheral area;

(B) forming on said surface of said silicon substrate a tunnel oxide layer in said core area and a gate oxide layer in said peripheral area, contaminate nitrogen forming in said gate oxide layer, at least some of said contaminate nitrogen forming a bond with the silicon substrate in contact with said gate oxide layer;

(C) forming a floating gate in said core area over said tunnel oxide layer;

(D) depositing a multilayered dielectric film on the surface of said field oxide regions, floating gate and gate oxide layer;

(E) forming a photoresist layer over the portion of said multilayered film overlying said floating gate;

(F) etching said multilayered film formed during step (D) in the areas not protected by the photoresist layer formed during step (E);

(G) contacting said gate oxide layer and contaminate nitrogen with a gas comprising ozone at a temperature of about 850° C. to about 950° C. for an effective period of time to break the bond formed between said contaminate nitrogen and silicon substrate; and (H) removing said gate oxide layer and contaminate nitrogen from said surface of said silicon substrate.

BRIEF DESCRIPTION OF THE DRAWINGS

In the annexed drawings, like parts and features have like references.

DETAILED DESCRIPTION OF THE PREFERRED EMBODIMENTS(S)

Figure 1:
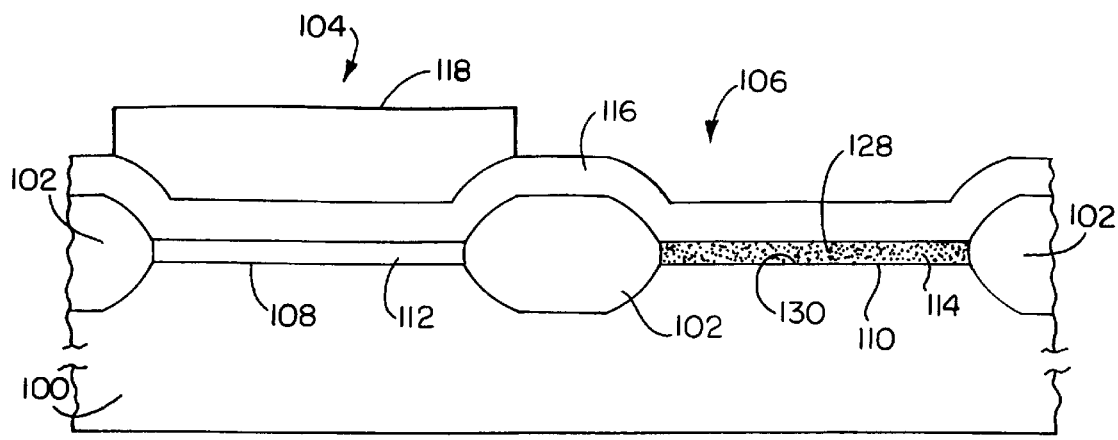
FIG. 1 is a schematic cross-sectional illustration of a structure used for making a non-volatile memory cell, the structure comprising a silicon substrate with field oxide regions formed on its surface, a core area having a tunnel oxide layer, a peripheral area having a gate oxide layer, a polycrystalline silicon film overlying the overall surface of the structure, and a photoresist layer overlying the portion of the polycrystalline silicon film in the core area; contaminate nitrogen having formed in said gate oxide layer, at least some of said contaminate nitrogen forming a bond with the silicon substrate in contact with said gate oxide layer.

The description of the preferred embodiment(s) will be provided with reference to the drawings. Referring to FIG. 1, spaced field oxide regions 102 are formed on silicon substrate (e.g., silicon wafer) 100. The substrate 100 can have any thickness suitable for making a non-volatile memory device, with thicknesses in the range of about 500 to about 600 $\mu$m, being typical. A core area 104 and a peripheral area 106 are located in the spaces between the field oxide regions 102. A tunnel region 108 is located in the core area 104. A gate region 110 is located in the peripheral area 106.

The field oxide regions 102 are formed using known techniques. In one embodiment, the field oxide regions 102 are formed by initially depositing a silicon nitride ($Si_3N_4$) film layer on the silicon substrate to a thickness of about 1600 Å to about 1800 Å, and in one embodiment about 1700 Å. A photoresist layer is then deposited on the silicon nitride film layer. Examples of the photoresist materials that can be used include those available from Shipley or Shinetsu. A pattern covering the core area 104 and peripheral area 106 is placed over the photoresist layer. The uncovered portions of the photoresist layer are then developed after exposing them to UV (ultra violet) light. The covered portions of the photoresist layer remain undeveloped.

The silicon nitride layer overlying the locations for the field oxide regions 102 is etched using known etching techniques. Examples of the etching materials that can be used include $CHF_3$ and $O_2$. Field oxide is grown in the locations for the field oxide regions 102 to a thickness of about 2500 Å to about 4000 Å, using dry oxidation at a temperature of about 1025° C. to about 1125° C. and atmospheric pressure.

Tunnel oxide layer 112 and gate oxide layer 114 are formed in tunnel region 108 and gate region 110, respectively, using the following procedure. The surface of substrate 100 is etched with $H_3PO_4$ at about 150° C. for an effective period of time to remove the silicon nitride layer from the tunnel region 108 and gate region 110. The substrate is then contacted with a hydrofluoric acid solution for an effective period of time to remove pad oxides formed in the tunnel region 108 and gate region 110. The hydrofluoric acid solution can be, for example, a dilute hydrofluoric acid solution having an $H_2O$:HF ratio of about 40:1. The resulting structure is then subjected to two oxidation steps to grow oxide layers 112 and 114 to thicknesses of about 80 Å to about 100 Å, and in one embodiment about 90 Å.

The first oxidation step to grow oxide layers 112 and 114 involves contacting the substrate with a gaseous mixture containing: argon at a concentration of about 85 to about 95% by volume, and in one embodiment about 90% by volume; HCl at a concentration of about 0.4 to about 0.6% by volume and in one embodiment about 0.5% by volume; and oxygen at a concentration of about 9 to about 10% by volume, and in one embodiment about 9.5% by volume. Nitrogen can be used in place of the argon. The temperature is in the range of about 1000° C. to about 1050° C., and the pressure is atmospheric. The oxide layer grown with this first oxidation step has a thickness of about 65 Å to about 75 Å, and in on embodiment about 70 Å.

The oxide layers 112 and 114 are then subjected to a second oxidation step to increase the thickness of the oxide layers by an additional amount of about 15 Å to about 25 Å, and in one embodiment about 20 Å. The second oxidation step involves contacting the oxide layers from the first oxidation step with a gaseous mixture containing: argon at a concentration of about 85% to about 95% by volume, and in one embodiment about 90% by volume; $N_2O$ at a concentration of about 2 to about 2.7% by volume, and in one embodiment about 2.5% by volume; and oxygen at a concentration of about 7 to about 8% by volume, and in one embodiment about 7.5% by volume. Examples of inert gases that can be used in place of argon include nitrogen. The temperature is in the range of about 900° C. to about 950° C. The pressure is atmospheric. This process can be referred as an oxynitride process or oxynitridation.

A problem that occurs with this oxynitridation process is that contaminate nitrogen 128 forms in the gate oxide layer 114 and at least some of it reacts with the silicon surface 130 in the gate region 110. The reaction between the contaminate nitrogen 128 and the silicon surface 130 forms a bond which, while not wishing to be bound by theory, is believed to be an Si—N bond. The contaminate nitrogen changes the characteristics of the oxide layer 114, and it cannot be effectively removed using conventional techniques such as hydrofluoric acid immersion or reoxidation.

A polycrystalline silicon film 116 is formed on the overall surface of the structure. The polycrystalline silicon film 116 has a thickness of about 800 Å to about 1000 Å, and in one embodiment to about 900 Å. The polycrystalline silicon film 116 can be formed using known techniques. In one embodiment, the polycrystalline silicon film 116 is formed by vapor depositing $SiH_4$ on the surface of the structure at a temperature of about 530° C., and a pressure of about 0.4 torr.

A photoresist layer 118 is formed on the polycrystalline silicon film 116 over the core area 104. The photoresist material can be any photoresist material known in the art. Examples include those available from Shipley or Shinetsu. The photoresist layer 118 is spun on the surface of the film 116 using known techniques. A pattern is then placed over the photoresist material. The photoresist material is developed in the core area. Photoresist layer 118 has a thickness in the range of about 8000 Å to about 10000 Å.

Figure 2:
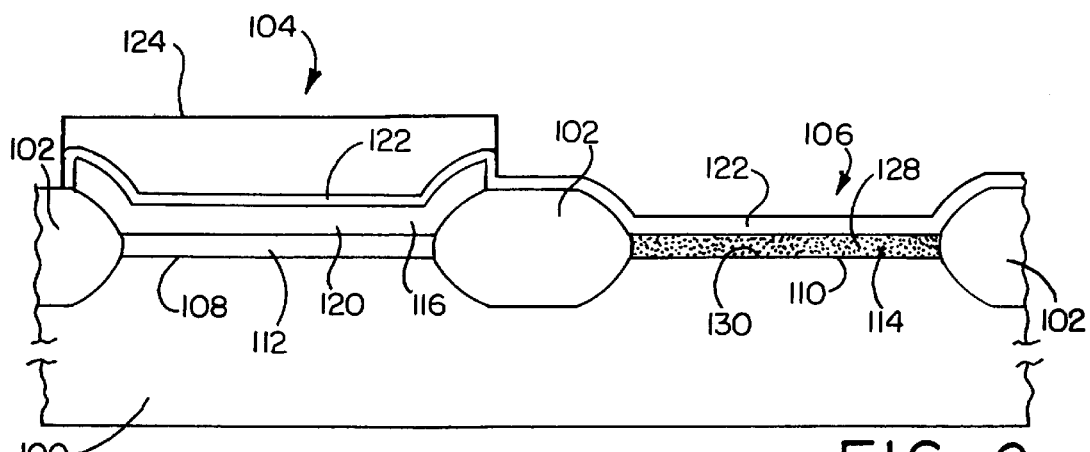
FIG. 2 is the structure illustrated in FIG. 1 except that the polycrystalline silicon film has been etched to form a floating gate in the core area, a multilayered dielectric film has been deposited on the surface of the overall structure, and a photoresist layer has been formed over the multilayered dielectric film in the core area.

Referring now to FIG. 2, the polycrystalline silicon film 116 in the area not protected by photoresist layer 118 is etched. The etching material can be any etching material known in the art. Examples include gaseous mixtures of $Cl_2$ and $SF_6$. This etching process results in the formation of floating gate 120 in core region 104. Floating gate 120 is made of the polycrystalline silicon deposited as film layer 116. The photoresist layer 118 is then removed using known procedures.

A multilayered dielectric film 122 is deposited on the overall surface of the structure. Dielectric film 122 has three layers. The first layer, which overlies the surface of the structure, is a layer of $SiO_2$ having a thickness of about 40 Å to about 70 Å, and in one embodiment about 60 Å. The second layer, which overlies the first layer, is a layer of $Si_3N_4$ having a thickness of about 90 Å to about 100 Å, and in one embodiment about 100 Å. The third layer, which overlies the second layer, is a layer of $SiO_2$ having a thickness of about 30 Å to about 50 Å, and in one embodiment about 40 Å.

The first and third layers of $SiO_2$ are grown using wet oxidation at atmospheric pressure. The first layer is grown at a temperature of about 750° C. to about 850° C., and in one embodiment about 800° C. The third layer is grown at a temperature in the range of about 950° C. to about 1000° C. The second layer is applied by vapor depositing $Si_3N_4$ at a temperature in the range of about 600° C. to about 700° C., and in one embodiment about 670° C., and a pressure in the range of about 300 mTorr to about 400 mTorr, and in one embodiment about 330 mTorr to about 350 mTorr.

A photoresist layer 124 is formed over the dielectric film 122 in the core region 104 using known techniques and any photoresist material known in the art. The dielectric film 122 in the area not protected by the photoresist layer 124 is then removed by chemical etching. The etching material can be any etching material known in the art. The photoresist layer 124 is then removed.

Figure 3:
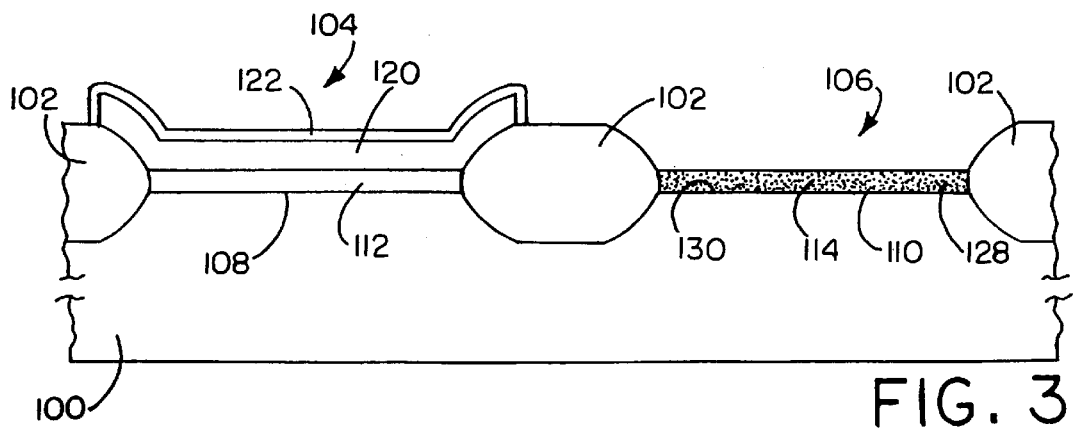
FIG. 3 is the structure illustrated in FIG. 2 except that the multilayered dielectric film in the area not protected by the photoresist layer has been etched and the photoresist layer over the core area has been removed.

Referring now to FIG. 3, the overall surface of the structure is cleaned using hydrofluoric acid as the cleaning material. The contaminate nitrogen 128 is then removed by first contacting the overall structure with an ozone-containing gas. In one embodiment, this gas is a gaseous mixture comprising oxygen and ozone. In one embodiment, the gas is in the form of a plasma. In one embodiment, the gas is a gaseous mixture which contains: from about 80% to about 90% by volume oxygen, and in one embodiment about 85% by volume oxygen; and about 10% to about 20% by volume ozone, and in one embodiment about 15% by volume ozone. The temperature of the gas is in the range of about 850° C. to about 950° C., and in one embodiment about 900° C. This contacting step is conducted at atmospheric pressure. The contacting with the ozone-containing gas is continued until the bond between the contaminate nitrogen 128 and the silicon surface 130 is broken. In one embodiment, the contacting is continued for about 25 to about 40 minutes, and in one embodiment about 30 minutes. While not wishing to be bound by theory, it is believed that the reaction breaking the bond between the contaminate nitrogen 128 and the silicon surface 130 proceeds as follows:

$$O_3 \rightarrow O_2 + O \quad (1)$$

$$Si_xO_yN_{z(interface)} + O \rightarrow Si_xO_{y+1} + zN \quad (2)$$

Figure 4:
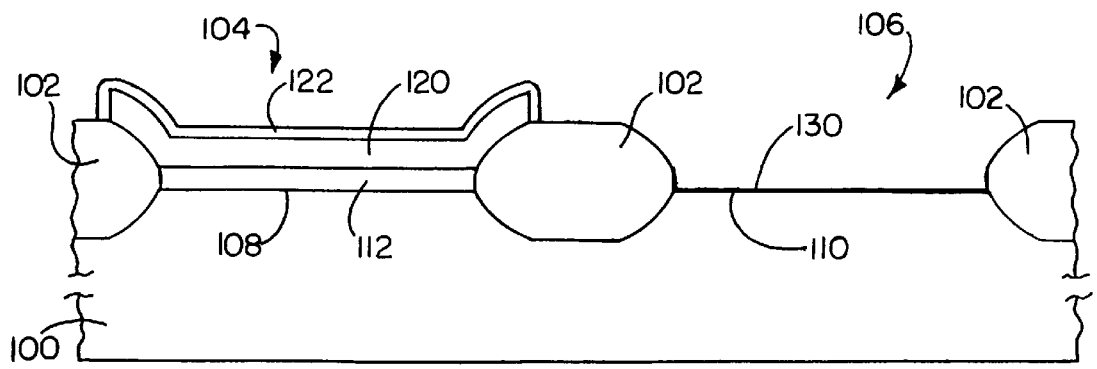
FIG. 4 is the structure illustrated in FIG. 3 except that the gate oxide layer and contaminate nitrogen have been removed.
Figure 5:
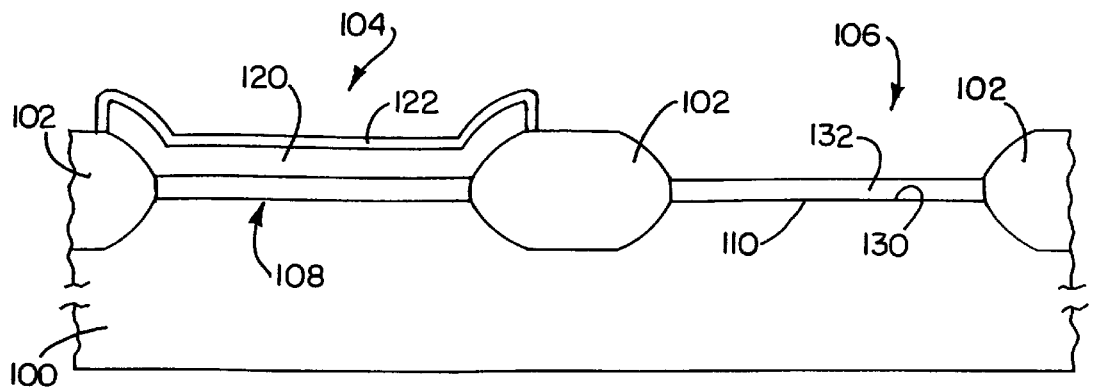
FIG. 5 is the structure illustrated in FIG. 4 except that a new gate oxide layer has been formed.

After the foregoing reaction is completed, the gate oxide layer 114 contains the contaminate nitrogen 128, but the bond between the contaminate nitrogen 128 and the silicon surface 130 is broken. The gate oxide layer 114, with the contaminate nitrogen 128, can then be removed using conventional etching techniques. The etching material can be any etching material known in the art. Examples include hydrofluoric acid. After the gate oxide layer 114 containing the contaminate nitrogen 128 is removed (see FIG. 4), a non-contaminated gate oxide layer 132 can be grown on the silicon surface 130 using conventional techniques (see FIG. 5). In one embodiment, gate oxide layer 132 is grown using wet oxidation at a temperature in the range of about 780° C. to about 900° C., and in one embodiment about 800° C., at atmospheric pressure.

Thereafter, the desired non-volatile memory device can be built using conventional procedures. These procedures include, for example, the construction of gate structures and the implantation of dopants, preceded by the application of specialized masks, and followed by the removal of such masks, all of such procedures being known to those skilled in the art.

INDUSTRIAL APPLICABILITY

This invention relates to an improved process for making a non-volatile memory device. The process involves the removal of contaminate nitrogen from the gate region following oxynitridation. The memory device built thereafter from the resulting structure can be used to make erasable programmable read only memories (EPROMS), electrically erasable programmable read only memories (EEPROMS), Flash EPROMS and Flash EEPROMS.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method for removing contaminate nitrogen from the gate region of a non-volatile memory device during production of said device, wherein the contaminate nitrogen has formed a bond with the surface of the silicon substrate in contact with the gate oxide layer in said gate region, said method comprising:

contacting said gate oxide layer and contaminate nitrogen with a gas comprising ozone at a temperature of about 850° C. to about 950° C. for an effective period of time to break said bond;

removing said gate oxide layer and contaminate nitrogen from said surface of said silicon substrate to expose said surface of said silicon substrate; and forming a non-contaminated oxide layer on said exposed surface of said silicon substrate.

2. The method of claim 1 wherein said gas comprises ozone and oxygen.

3. The method of claim 1 wherein said gas is in the form of a plasma.

4. The method of claim 1 wherein said contacting is conducted for about 25 to about 40 minutes.

5. The method of claim 1 wherein said gas is a gaseous mixture comprising from about 80% to about 90% by volume oxygen and about 10% to about 20% by volume ozone.

6. The method of claim 1 wherein said gas is at a temperature of about 900° C., and said contacting is conducted at atmospheric pressure.

7. The method of claim 1 wherein said removing step comprises etching said gate oxide layer and contaminate nitrogen with hydrofluoric acid.

8. A method for treating the surface of a silicon substrate, comprising:

(A) forming spaced field oxide regions on said surface of said silicon substrate, the spaces between said field oxide regions comprising a core area and a peripheral area;

(B) forming on said surface of said silicon substrate a tunnel oxide layer in said core area and a gate oxide layer in said peripheral area, contaminate nitrogen forming in said gate oxide layer, at least some of said contaminate nitrogen forming a bond with the silicon substrate in contact with said gate oxide layer;

(C) forming a floating gate in said core area over said tunnel oxide layer;

(D) depositing a multilayered dielectric film on the surface of said field oxide regions, floating gate and gate oxide layer;

(E) forming a photoresist layer over the portion of said multilayered film overlying said floating gate;

(F) etching said multilayered film formed during step (D) in the areas not protected by the photoresist layer formed during step (E);

(G) contacting said gate oxide layer and contaminate nitrogen with a gas comprising ozone at a temperature of about 850° C. to about 950° C. for an effective period of time to break the bond formed between said contaminate nitrogen and silicon substrate;

(H) removing said gate oxide layer and contaminate nitrogen from said silicon substrate to expose the surface of said silicon substrate; and (I) forming a non-contaminated oxide layer on said exposed surface of said silicon substrate.

9. The method of claim 8 wherein said multilayered dielectric film deposited during step (D) is comprised of three layers, the first layer being a layer of $SiO_2$, the second layer being a layer of $Si_3N_4$, and the third layer being a layer of $SiO_2$.

10. The method of claim 8 wherein said gas used in step (G) comprises from about 80 to about 90% by volume oxygen and from about 10 to about 20% by volume ozone.

* * * * *